US010766713B2

(12) United States Patent
Tsai

(10) Patent No.: US 10,766,713 B2
(45) Date of Patent: Sep. 8, 2020

(54) SUBSTRATE CARRIER APPARATUS AND LIQUID CRYSTAL DISPLAY MANUFACTURING DEVICE

(71) Applicants: HKC Corporation Limited, Shenzhen, Guangdong (CN); Chongqing HKC Optoelectronics Technology Co., Limited, Chongqing (CN)

(72) Inventor: Chia-Jen Tsai, Chongqing (CN)

(73) Assignees: HKC Corporation Limited, Shenzhen, Guangdong (CN); Chongqing HKC Optoelectronics Co., Ltd., Chongqing (CN)

( * ) Notice: Subject to any disclaimer, the term of this patent is extended or adjusted under 35 U.S.C. 154(b) by 289 days.

(21) Appl. No.: 15/578,604

(22) PCT Filed: Jul. 7, 2017

(86) PCT No.: PCT/CN2017/092146
§ 371 (c)(1),
(2) Date: Nov. 30, 2017

(87) PCT Pub. No.: WO2018/129881
PCT Pub. Date: Jul. 19, 2018

(65) Prior Publication Data
US 2018/0339866 A1 Nov. 29, 2018

(30) Foreign Application Priority Data

Jan. 11, 2017 (CN) .......................... 2017 1 0017763

(51) Int. Cl.
*G09G 3/00* (2006.01)
*B65G 47/22* (2006.01)
(Continued)

(52) U.S. Cl.
CPC ............... *B65G 47/22* (2013.01); *G09G 3/00* (2013.01); *H01L 21/6734* (2013.01);
(Continued)

(58) Field of Classification Search
USPC ................................................... 361/212, 220
See application file for complete search history.

(56) References Cited

U.S. PATENT DOCUMENTS

2011/0304564 A1* 12/2011 Kim ........................ G06F 3/044
345/173
2011/0316160 A1* 12/2011 Siepe .................. H01L 23/3735
257/751

(Continued)

FOREIGN PATENT DOCUMENTS

CN         1702495 A      11/2005
CN       101071785 A      11/2007
(Continued)

OTHER PUBLICATIONS

International Search Report for PCT/CN2017/092146, dated Oct. 11, 2017.

*Primary Examiner* — Danny Nguyen
(74) *Attorney, Agent, or Firm* — Juan Carlos A. Marquez; Marquez IP Law Office, PLLC

(57) ABSTRACT

This application provides a substrate carrier apparatus and a liquid crystal display (LCD) manufacturing device. The substrate carrier apparatus includes: a carrier platform, configured to carry a substrate; and a conductor, including a power receiving terminal and a ground terminal, where the power receiving terminal is electrically connected to the substrate, and the ground terminal is grounded.

4 Claims, 4 Drawing Sheets

(51) Int. Cl.
*H01L 21/673* (2006.01)
*H01L 29/866* (2006.01)
*H02H 9/04* (2006.01)
*H01L 23/00* (2006.01)
*H02H 3/20* (2006.01)
*H01L 27/02* (2006.01)
*H01L 23/535* (2006.01)

(52) U.S. Cl.
CPC ...... *H01L 21/67346* (2013.01); *H01L 23/535* (2013.01); *H01L 24/09* (2013.01); *H01L 27/0255* (2013.01); *H01L 29/866* (2013.01); *H02H 3/20* (2013.01); *H02H 9/046* (2013.01)

(56) References Cited

U.S. PATENT DOCUMENTS

| | | | |
|---|---|---|---|
| 2014/0176840 A1* | 6/2014 | Hashido | G02F 1/13306 349/33 |
| 2018/0102330 A1* | 4/2018 | Hsieh | H01L 21/4853 |

FOREIGN PATENT DOCUMENTS

| | | |
|---|---|---|
| CN | 203455557 U | 2/2014 |
| CN | 106783724 A | 5/2017 |

* cited by examiner

SUBSTRATE CARRIER APPARATUS AND LIQUID CRYSTAL DISPLAY MANUFACTURING DEVICE

BACKGROUND

Technical Field

This application relates to a carrier apparatus, and in particular, to a substrate carrier apparatus and a liquid crystal display (LCD) manufacturing device.

Related Art

Currently, development of the LCD manufacturing industry has reached a relatively high level. Strict quality requirements and yield improvement depend on an inspection mechanism and improvement of highly advanced technologies. An LCD manufacturing engineer is duty-bound to reduce a failure rate in an LCD process. However, an electrostatic problem such as an electrostatic breakdown of an LCD or contamination inside a panel caused by electrostatically attracted dust often occurs in current manufacturing.

In the foregoing descriptions, a breakdown and damage of a component caused by the electrostatic breakdown is most common and serious in the electronic industry, and in particular, in electronic product manufacturing. Electrostatic discharge may cause a hard breakdown or a soft breakdown of a component. The hard breakdown causes a permanent failure of a component once, for example, an input/output open or short circuit of the component. The soft breakdown may cause performance deterioration of a component, and cause a potential fault by lowering an indicator parameter of the component. The soft breakdown may cause a circuit to be occasionally normal or abnormal (as a result of lowering of an indicator parameter) and is not easily detected, greatly affecting operation of an entire system and fault removal. A device can still work in a case of a soft breakdown, and performance is not essentially changed. Therefore, the device seems to be all right during delivery inspection, but a device failure may be caused at any time. A plurality of soft breakdowns can lead to a hard breakdown, causing abnormal operation of a device. This not only brings losses to users, but also affects reputation of manufacturers and sales of products.

In addition, in the foregoing descriptions, electrostatic attraction mainly occurs when insulativity of a component is quite good. Unavoidable friction during usage of the component may lead to continuous accumulation of electric charges on a surface of the component, and an electric potential becomes higher. In this case, because of a mechanical effect of static electricity, floating dust in a workplace is prone to be attracted onto a surface of a component. Because very slight dust attraction may affect good performance of the component, electronic products need to be produced in a clean environment, and a series of antistatic operations need to be performed on operators, tools, and the environment, to avoid and reduce electrostatic damage.

Currently, there are two common methods for removing static electricity. First, static electricity is discharged by means of grounding (that is, a grounding method). Second, static electricity is neutralized by generating ions in the air (that is, an ion neutralization method).

The related art discloses that the grounding method is not used when an insulating material is used. Japanese Unexamined Patent Publication No. 9-36207 discloses a technology in which a finger (on which a substrate is disposed) is formed by using a polyimide polymer. For another example, Japanese Publication No. 10-509747 discloses that carriers of an anti-erosion composite material include a basic polymer selected from polyolefine and polyamide and a grinding carbon fiber filler having a particular average fiber diameter. In addition, Japanese Unexamined Patent Publication No. 11-106665 discloses a transfer member formed by a thermoplastic polymer having a preset surface resistivity and a fibrous conductive filler having a preset volume resistivity.

The grounding method cannot be used for a component supported and transferred by using an insulating transfer member such as a plastic transfer member or a ceramic transfer member. Therefore, static electricity of a component transferred by using a transfer member such as a CFRP can be removed only by using, the ion neutralization method. However, the ion neutralization method may also have problems. Electromagnetic noise, fine particles, and ozone are sometimes generated when an ion neutralizing apparatus is used. These generated elements may have negative impact on a manufacturing process. For another example, in the ion neutralization method, a bias produced by a difference between a quantity of positive ions and a quantity of negative ions is sometimes generated, and there is another possibility, that is, extra static electricity may be generated.

Further, a contact area between a glass carrier platform of a device and a glass increases as a dimension of the glass becomes larger, leading to electrostatic problems and frequent substrate breakdown events.

Most electrostatic problems are prevented by using an electrostatic eliminator. However, an electrostatic elimination effect is unsatisfactory in most cases, unless an electrostatic elimination apparatus with higher costs is used.

A common electrostatic neutralizer (ionizer) can only blow onto a surface of a substrate, and for a lower surface of the substrate, static electricity cannot be completely removed because the electrostatic neutralizer cannot blow onto the lower surface. As a result, electrostatic discharge (ESD) or adhesion are prone to occur.

In the related art, for example, US Patent No. 2008259236 discloses an LCD production method. The method includes: disposing a substrate on a platform, and performing, on the substrate, at least one of a plurality of processing operations for forming an electronic apparatus array on the substrate. The platform is an ESD dissipation platform and has a surface. The surface has a volume resistivity (Rv) in a range of approximately 1 E 5 Ω cm to approximately 1 E 11 Ω cm. In addition, according to another aspect, this application discloses an LCD platform. The platform includes a main body having a surface. The surface is made of an electrostatic discharge (ESD) dissipation material, and has a volume resistivity (Rv) in a range of approximately 1 E 5 Ω cm to approximately 1 E 11 Ω cm.

However, the foregoing technology discloses only electrostatic discharge on a platform, and discharge can be implemented only when a substrate is completely in contact with the platform.

Based on the foregoing descriptions, an apparatus and a method for improving a substrate conveying machine are needed, so as to improve production efficiency, a quantity of production, and quality of LCD panels.

SUMMARY

To resolve the foregoing technical problem, an objective of this application is to provide a substrate carrier apparatus, and in particular, to provide a substrate carrier apparatus and an LCD manufacturing device. A conductor is electrically connected to a substrate located on a carrier platform, so that electricity can be removed or neutralized at any time, and static electricity generated by friction with air during transfer of the substrate or static electricity from outside can be eliminated, thereby avoiding static electricity. In addition to the foregoing descriptions, the electrostatic neutralizer or the electrostatic eliminator known and used in the related art does not need to be used in this application. Therefore, extra electric power may not be required, thereby reducing costs. In this application, because the conductor is electrically connected to the substrate located on the carrier platform, mounting is easy, and time can be efficiently saved. In this application, an ESD rope is used as a conductor. Because the ESD rope neither oxidizes nor rusts, contamination is avoided.

A substrate carrier apparatus for carrying a substrate provided in this application comprises: a carrier platform, configured to carry a substrate; and a conductor, comprising a power receiving terminal and a ground terminal, where the power receiving terminal is electrically connected to the substrate, and the ground terminal is grounded.

The objective of this application may be further achieved and the technical problem of this application may be further resolved by using the following technical solutions.

In an embodiment of this application, the conductor is located between the substrate and the carrier platform.

In an embodiment of this application, the conductor is a slightly flexible conducting material.

In an embodiment of this application, the conductor is a conducting wire.

In an embodiment of this application, the conductor is an ESD rope.

In an embodiment of this application, a diameter of the ESD rope is approximately 1 millimeter.

In an embodiment of this application, a distance between the ESD rope and the substrate is less than 3 centimeters.

In an embodiment of this application, the conductor is electrically connected to an edge of the substrate.

In an embodiment of this application, there is a plurality of conductors respectively electrically connected to edges of the substrate.

Another objective of this application is to provide an LCD manufacturing device, comprising a substrate carrier apparatus, where the substrate carrier apparatus comprises: a carrier platform, configured to carry a substrate; and a conductor, comprising a power receiving terminal and a ground terminal, where the power receiving terminal is electrically connected to the substrate, and the ground terminal is grounded.

The objective of this application may be further achieved and the technical problem of this application may be further resolved by using the following technical solutions.

In an embodiment of this application, the conductor is located between the substrate and the carrier platform.

In an embodiment of this application, the conductor is a slightly flexible conducting material.

In an embodiment of this application, the conductor is a conducting wire.

In an embodiment of this application, the conductor is an ESD rope.

In an embodiment of this application, a diameter of the ESD rope is approximately 1 millimeter.

In an embodiment of this application, a distance between the ESD rope and the substrate is less than 3 centimeters.

In an embodiment of this application, the conductor is electrically connected to an edge of the substrate.

In an embodiment of this application, there is a plurality of conductors respectively electrically connected to edges of the substrate.

Another objective of this application is to provide a substrate carrier apparatus, applied to manufacture at least one display, comprising: a carrier platform, configured to carry a substrate; and a conductor, comprising a power receiving terminal and a ground terminal, where the power receiving terminal is electrically connected to the substrate, and the ground terminal is grounded; the conductor is located between the substrate and the carrier platform; the conductor is a conducting wire or an ESD rope made of a slightly flexible conducting material; a diameter of the ESD rope is 1 millimeter, and a distance between the ESD rope and the substrate is less than 3 centimeters; the substrate is of a rectangular shape or a square shape; and there is a plurality of conductors respectively electrically connected to corners of the substrate.

In this application, a conductor is electrically connected to a substrate located on a carrier platform, so that electricity can be removed or neutralized at any time, and static electricity generated by friction with air during transfer of the substrate or static electricity from outside can be eliminated, thereby avoiding static electricity. In addition to the foregoing descriptions, the electrostatic neutralizer or the electrostatic eliminator known and used in the related art does not need to be used in this application. Therefore, extra electric power may not be required, thereby reducing costs, in this application, because the conductor is electrically connected to the substrate located on the carrier platform, mounting is easy, and time can be efficiently saved. In this application, an ESD rope is used as a conductor. Because the ESD rope neither oxidizes nor rusts, contamination is avoided.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

The accompanying drawings and the descriptions are considered to be essentially exemplary, rather than limitative. In the figures, units with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, an area, and the like are enlarged. In the accompanying drawings, for understanding and ease of description, thicknesses of some layers and areas are enlarged. It should be understood that when a component such as a layer, a film, an area, or a base is described to be "on" "another component", the component may be directly on the another component, or there may be an intermediate component.

In addition, in this specification, unless otherwise explicitly described to have an opposite meaning, the term "include" is understood as including the component, but not excluding any other component. In addition, in this specification, "on" means that a component is located on or below a target component, but does not mean that the component needs to be located on top of the gravity direction.

To further describe the technical means adopted in this application to achieve the intended application objective and effects thereof, specific implementations, structures, features, and effects of a substrate carrier apparatus and an LCD manufacturing device provided according to the present disclosure are described below in detail with reference to the accompanying drawings and preferred embodiments.

Figure 1:
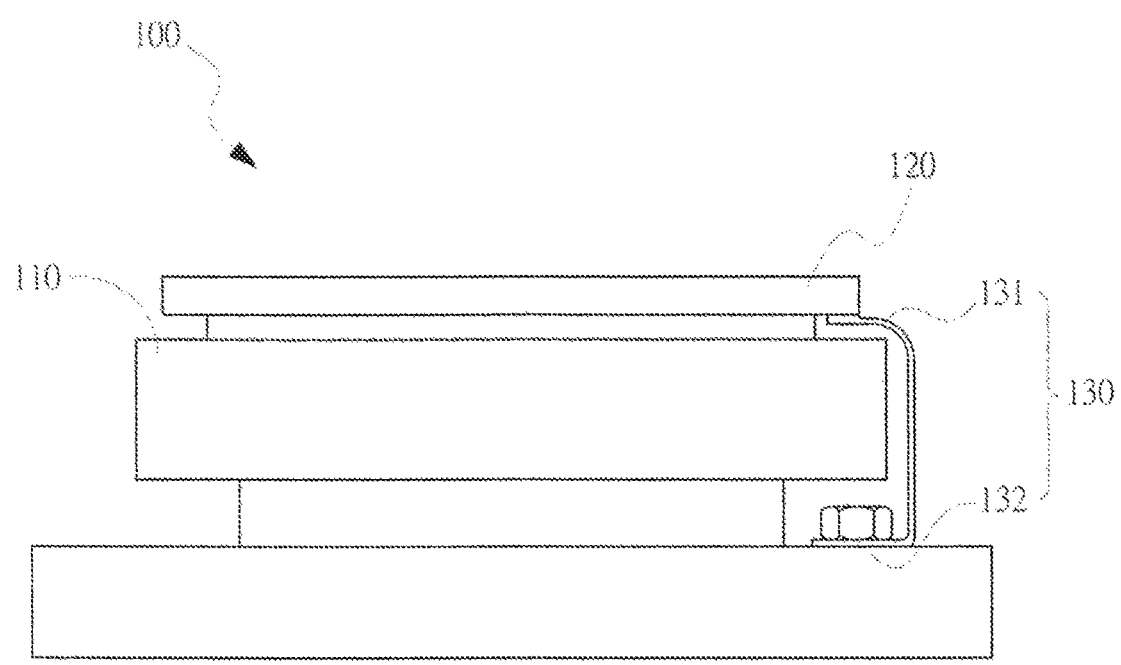
FIG. 1 is a schematic diagram of a substrate carrier apparatus according to an embodiment of this application.
Figure 2:
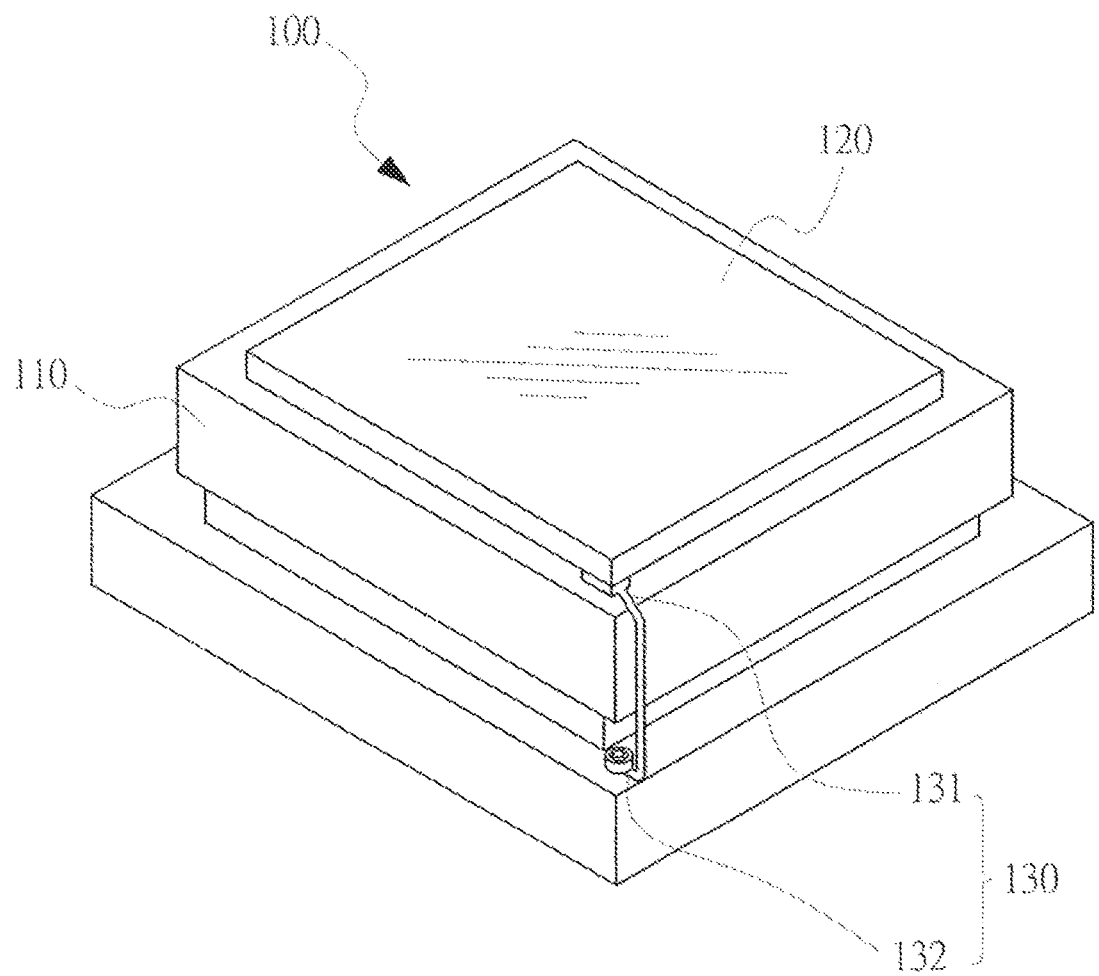
FIG. 2 is a partial schematic diagram showing that a conductor of a substrate carrier apparatus is electrically connected to a substrate and is grounded according to an embodiment of this application.
Figure 3:
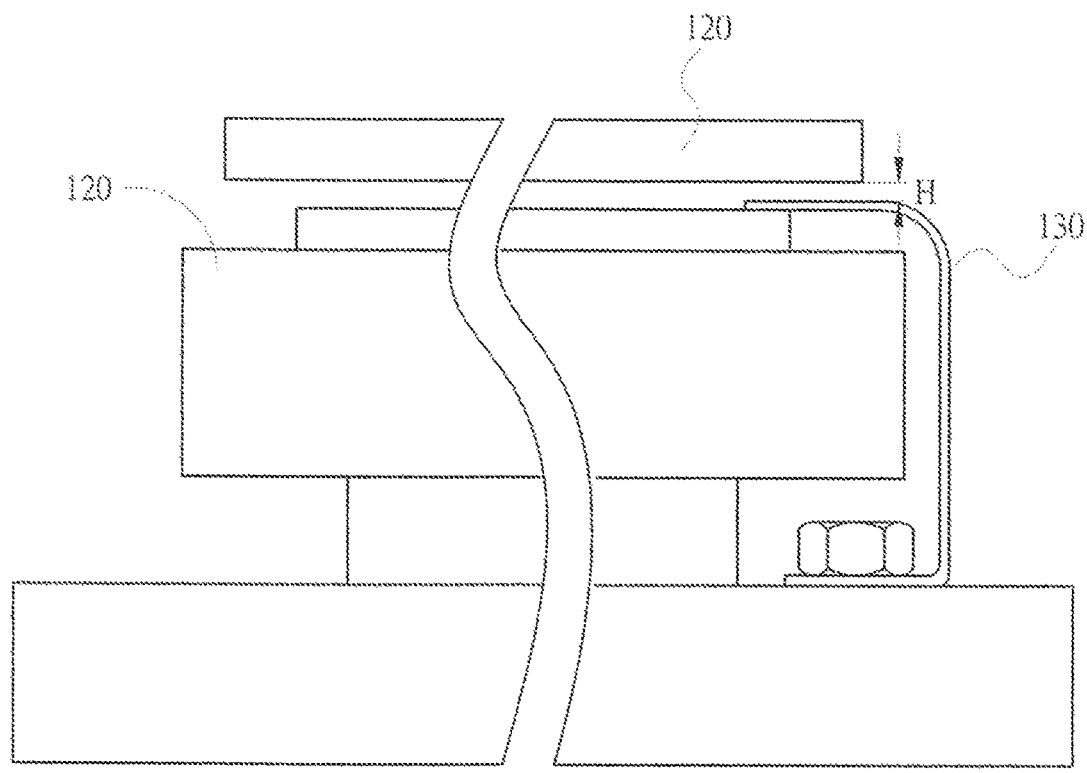
FIG. 3 is a schematic diagram of a distance between a conductor of a substrate carrier apparatus and a substrate according to an embodiment of this application and FIG. 4 is a schematic diagram showing that a plurality of conductors of a substrate carrier apparatus is respectively electrically connected to corners of a substrate according to an embodiment of this application.
Figure 4:
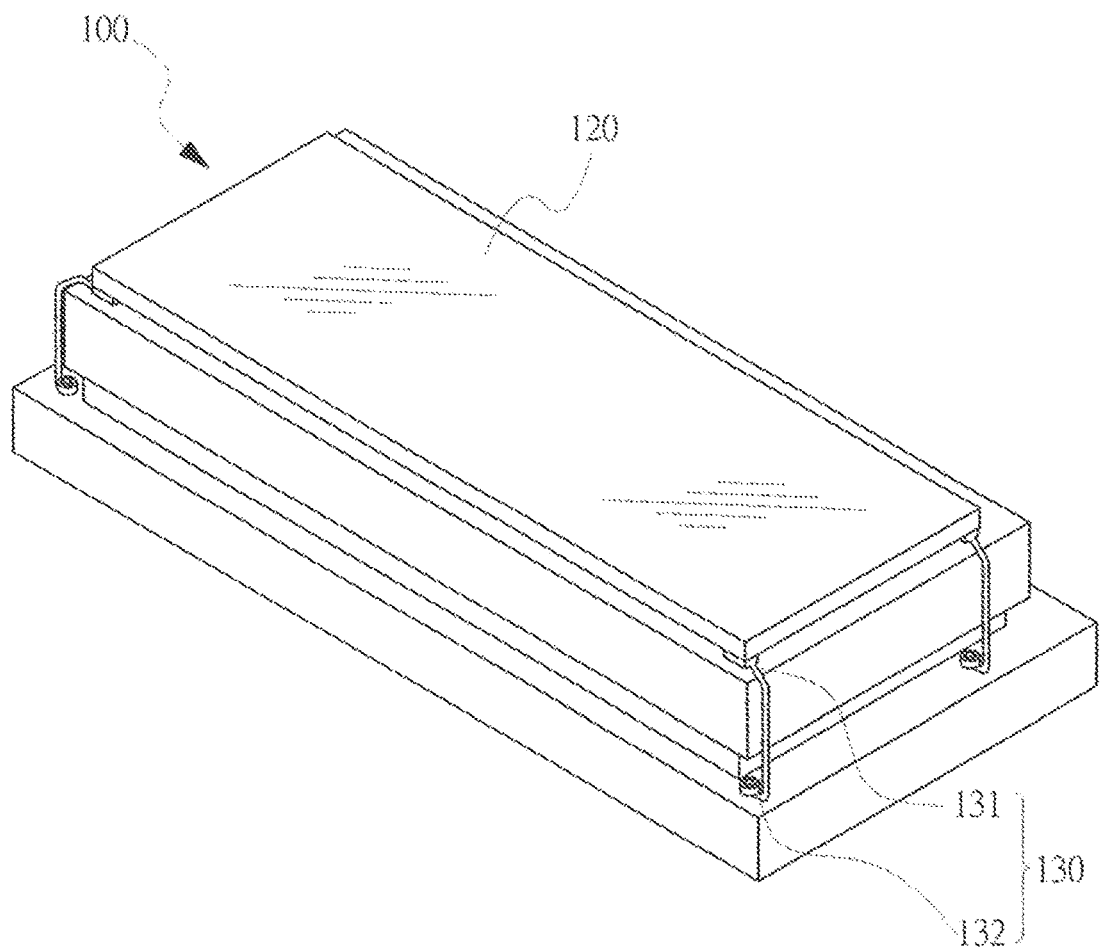

Referring to FIG. 1 to FIG. 4, FIG. 1 is a schematic diagram of a substrate carrier apparatus according to an embodiment of this application; FIG. 2 is a partial schematic diagram showing that a conductor of a substrate carrier apparatus is electrically connected to a substrate and is grounded according to an embodiment of this application; FIG. 3 is a schematic diagram of a distance between a conductor of a substrate carrier apparatus and a substrate according to an embodiment of this application; FIG. 4 is a schematic diagram showing that a plurality of conductors of a substrate carrier apparatus is respectively electrically connected to corners of a substrate according to an embodiment of this application. Referring to FIG. 1 and FIG. 2, a substrate carrier apparatus 100 for carrying a substrate provided in this application includes: a carrier platform 110, configured to carry a substrate 120; and a conductor 130, including a power receiving terminal 131 and a ground terminal 132. The power receiving terminal 131 is electrically connected to the substrate 120, and the ground terminal 132 is grounded.

The objective of this application may be further achieved and the technical problem of this application may be further resolved by using the following technical solutions.

In an embodiment of this application, the conductor 130 is located between the substrate 120 and the carrier platform 110. More specifically, the power receiving terminal 131 of the conductor 130 is located between the substrate 120 and the carrier platform 110.

In an embodiment of this application, the conductor 130 is a slightly flexible conducting material.

In an embodiment of this application, the conductor 130 is a conducting wire.

In an embodiment of this application, the conductor 130 is an ESD rope. A diameter of the ESD rope is approximately 1 millimeter.

In an embodiment of this application, as shown in FIG. 3, a distance H between the ESD rope and the substrate is less than 3 centimeters.

In an embodiment of this application, as shown in FIG. 4, the conductor 130 is electrically connected to an edge of the substrate 120. Further, there is a plurality of conductors 130 respectively electrically connected to edges of the substrate 120. When the substrate 120 is of a rectangular shape or a square shape, there is a plurality of conductors 130 respectively electrically connected to corners of the substrate.

As described above, another objective of this application is to provide an LCD manufacturing device, including a substrate carrier apparatus. Still referring to FIG. 1 to FIG. 4, FIG. 1 is a schematic diagram of a substrate carrier apparatus according to an embodiment of this application; FIG. 2 is a partial schematic diagram showing that a conductor of a substrate carrier apparatus is electrically connected to a substrate and is grounded according to an embodiment of this application; FIG. 3 is a schematic diagram of a distance between a conductor of a substrate carrier apparatus and a substrate according to an embodiment of this application; FIG. 4 is a schematic diagram showing that a plurality of conductors of a substrate carrier apparatus is respectively electrically connected to corners of a substrate according to an embodiment of this application. Referring to FIG. 1 and FIG. 2, a substrate carrier apparatus 100 for carrying a substrate provided in this application includes: a carrier platform 110, configured to carry a substrate 120; and a conductor 130, including a power receiving terminal 131 and a ground terminal 132. The power receiving terminal 131 is electrically connected to the substrate 120, and the ground terminal 132 is grounded.

The objective of this application may be further achieved and the technical problem of this application may be further resolved by using the following technical solutions.

In an embodiment of this application, the conductor 130 is located between the substrate 120 and the carrier platform 110. More specifically, the power receiving terminal 131 of the conductor 130 is located between the substrate 120 and the carrier platform 110.

In an embodiment of this application, the conductor 130 is a slightly flexible conducting material.

In an embodiment of this application, the conductor 130 is a conducting wire.

In an embodiment of this application, the conductor 130 is an ESD rope. A diameter of the ESD rope is approximately 1 millimeter.

In an embodiment of this application, as shown in FIG. 3, a distance H between the ESD rope and the substrate is less than 3 centimeters.

In an embodiment of this application, as shown in FIG. 4, the conductor 130 is electrically connected to an edge of the substrate 120. Further, there is a plurality of conductors 130 respectively electrically connected to edges of the substrate 120. When the substrate 120 is of a rectangular shape or a square shape, there is a plurality of conductors 130 respectively electrically connected to corners of the substrate.

In this application, a conductor is electrically connected to a substrate located on a carrier platform, so that electricity can be removed or neutralized at any time, and static electricity generated by friction with air during transfer of the substrate or static electricity from outside can be eliminated, thereby avoiding static electricity. In addition to the foregoing descriptions, the electrostatic neutralizer or the electrostatic eliminator known and used in the related art does not need to be used in this application. Therefore, extra electric power may not be required, thereby reducing costs. In this application, because the conductor is electrically connected to the substrate located on the carrier platform, mounting is easy, and time can be efficiently saved. In this application, an ESD rope is used as a conductor. Because the ESD rope neither oxidizes nor rusts, contamination is avoided.

The terms such as "in some embodiments" and "in various embodiments" are repeatedly used. The terms usually refer to different embodiments, but they may further refer to a same embodiment. The terms such as "comprising", "having" and "including" are synonyms, unless other meanings are indicated in the context.

The foregoing descriptions are merely preferred embodiments of this application, and are not intended to limit this application. Although this application has been disclosed above through the preferred embodiments, the embodiments are not intended to limit this application. A person skilled in the art can make some equivalent variations, alterations or modifications to the above-disclosed technical content without departing from the scope of the technical solutions of this application to obtain equivalent embodiments. Any simple alteration, equivalent change or modification made to the above embodiments according to the technical essence of this application without departing from the content of the technical solutions of this application shall fall within the scope of the technical solutions of this application.

What is claimed is:

1. A substrate carrier apparatus, applied to manufacture at least one display, comprising:
   a carrier platform, configured to carry a substrate; and
   a conductor, comprising a power receiving terminal and a ground terminal, wherein the power receiving terminal is electrically connected to the substrate, and the ground terminal is grounded;
   wherein the conductor is a conducting wire or an electrostatic discharge (ESD) rope made of a slightly flexible conducting material;
   wherein a diameter of the ESD rope is 1 millimeter, and a distance between the ESD rope and the substrate is less than 3 centimeters; and
   wherein there is a plurality of conductors respectively electrically connected to corners of the substrate.

2. The substrate carrier apparatus according to claim 1, wherein the conductor is located between the substrate and the carrier platform.

3. A liquid crystal display (LCD) manufacturing device, comprising a substrate carrier apparatus, wherein the substrate carrier apparatus comprises:
   a carrier platform, configured to carry a substrate; and
   a conductor, comprising a power receiving terminal and a ground terminal, wherein the power receiving terminal is electrically connected to the substrate, and the ground terminal is grounded; and
   the conductor is located between the substrate and the carrier platform;
   wherein the conductor is a conducting wire or an electrostatic discharge (ESD) rope made of a slightly flexible conducting material;
   wherein a diameter of the ESD rope is 1 millimeter, and a distance between the ESD rope and the substrate is less than 3 centimeters; and
   wherein there is a plurality of conductors respectively electrically connected to corners of the substrate.

4. A substrate carrier apparatus, applied to manufacture at least one display, comprising:
   a carrier platform, configured to carry a substrate; and
   a conductor, comprising a power receiving terminal and a ground terminal, wherein the power receiving terminal is electrically connected to the substrate, and the ground terminal is grounded;
   the conductor is located between the substrate and the carrier platform, and the power receiving terminal of the conductor is located between the substrate and the carrier platform;
   the conductor is a conducting wire or an electrostatic discharge (ESD) rope made of a slightly flexible conducting material;
   a diameter of the ESD rope is 1 millimeter, and a distance between the ESD rope and the substrate is less than 3 centimeters;
   the substrate is of a rectangular shape or a square shape; and
   there is a plurality of conductors respectively electrically connected to corners of the substrate.

* * * * *